(12) United States Patent
Lee et al.

(10) Patent No.: US 6,656,831 B1
(45) Date of Patent: Dec. 2, 2003

(54) PLASMA-ENHANCED CHEMICAL VAPOR DEPOSITION OF A METAL NITRIDE LAYER

(75) Inventors: Wei Ti Lee, San Jose, CA (US); Ted Guo, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/491,563

(22) Filed: Jan. 26, 2000

(51) Int. Cl.$^7$ .......................................... H01L 21/4763

(52) U.S. Cl. ...................... 438/627; 438/629; 438/643; 438/653; 438/658; 438/681

(58) Field of Search ................................ 438/627, 629, 438/643, 653, 658, 681; 427/99, 126.1

(56) References Cited

U.S. PATENT DOCUMENTS

| | | | | |
|---|---|---|---|---|
| 4,420,498 | A | 12/1983 | Hirose et al. .................. 427/39 |
| 4,951,601 | A | 8/1990 | Maydan et al. ............. 118/719 |
| 5,186,718 | A | 2/1993 | Tepman et al. ............. 29/25.01 |
| 5,207,878 | A | * 5/1993 | Shimo et al. ........... 204/157.41 |
| 5,250,467 | A | 10/1993 | Somekh et al. ............. 437/192 |
| 5,279,857 | A | 1/1994 | Eichman et al. ............ 427/255 |
| 5,300,321 | A | 4/1994 | Nakano et al. .......... 427/248.1 |
| 5,312,774 | A | 5/1994 | Nakamura et al. .......... 437/192 |
| 5,330,793 | A | 7/1994 | Winter et al. ............ 427/248.1 |
| 5,391,517 | A | 2/1995 | Gelatos et al. ............. 437/190 |
| 5,399,379 | A | 3/1995 | Sandhu ..................... 427/255.2 |
| 5,416,045 | A | * 5/1995 | Kauffman et al. .......... 438/660 |
| 5,420,072 | A | * 5/1995 | Fiordalice et al. ....... 427/126.1 |
| 5,496,762 | A | * 3/1996 | Sandhu et al. ...... 148/DIG. 117 |
| 5,508,066 | A | 4/1996 | Akahori ...................... 427/571 |
| 5,514,425 | A | 5/1996 | Ito et al. ..................... 427/534 |

(List continued on next page.)

FOREIGN PATENT DOCUMENTS

| | | | |
|---|---|---|---|
| EP | 0 776 037 | 5/1997 | ......... H01L/21/768 |
| EP | 0 837 155 | 4/1998 | ........... C23C/16/44 |
| EP | 0 840 363 | 5/1998 | ......... H01L/21/285 |
| EP | 0 871 218 | 10/1998 | ......... H01L/21/768 |
| JP | 8337875 A | * 12/1993 | |
| JP | 63-9925 | 1/1998 | ........... H01L/21/28 |
| JP | 11-288940 | 10/1999 | ....... H01L/21/3205 |
| WO | WO-96/12048 | * 4/1996 | |
| WO | 99/63590 | 12/1999 | ......... H01L/21/768 |

OTHER PUBLICATIONS

Hara et al., "Formation of Titanium Nitride Layers by the Nitridation of Titanium in High–Pressure Ammonium Ambient," Applied Physics Letters 57, Oct. 15, 1990, No. 16, pp. 1660–1662.

Search Report for EP No. 01101630.0, dated May 18, 2001.

*Primary Examiner*—George Fourson
*Assistant Examiner*—Michelle Estrada
(74) *Attorney, Agent, or Firm*—Moser, Patterson & Sheridan, LLP

(57) ABSTRACT

A refractory metal layer is deposited onto a substrate having high aspect ratio contracts or vias formed thereon. Next, a plasma-enhanced CVD refractory metal nitride layer is deposited on the refractory metal layer. Then, a metal layer is deposited over the metal nitride layer. The resulting metal layer is substantially void free and has reduced resistivity, and has greater effective line width. Plasma-enhanced chemical vapor deposition of the metal nitride layer comprises forming a plasma of a metal-containing compound, a nitrogen-containing gas, and a hydrogen-gas to deposit a metal nitride layer on a substrate. The metal nitride layer is preferably treated with nitrogen plasma to densify the metal nitride film. The process is preferably carried out in an integrated processing system that generally includes various chambers so that once the substrate is introduced into a vacuum environment, the metallization of the vias and contacts occurs without exposure to possible contaminants.

28 Claims, 5 Drawing Sheets

U.S. PATENT DOCUMENTS

| | | | |
|---|---|---|---|
| 5,607,776 A | | 3/1997 | Mueller et al. .............. 428/472 |
| 5,721,021 A | | 2/1998 | Tobe et al. ................. 427/570 |
| 5,747,116 A | * | 5/1998 | Sharan et al. .......... 427/255.26 |
| 5,834,068 A | * | 11/1998 | Chern et al. ............. 427/248.1 |
| 5,846,332 A | | 12/1998 | Zhao et al. ................. 118/728 |
| 5,877,087 A | | 3/1999 | Mosely et al. .............. 438/656 |
| 5,956,613 A | * | 9/1999 | Zhao et al. ........... 427/255.394 |
| 5,970,378 A | * | 10/1999 | Shue et al. ................. 438/656 |
| 5,972,179 A | * | 10/1999 | Chittipeddi et al. ... 204/192.15 |
| 5,993,916 A | | 11/1999 | Zhao et al. ................. 427/535 |
| 6,013,576 A | * | 1/2000 | Oh et al. .................... 427/576 |
| 6,024,269 A | * | 2/2000 | Ho et al. .................... 227/130 |
| 6,051,281 A | * | 4/2000 | Kobayashi et al. ......... 427/253 |
| 6,063,441 A | * | 5/2000 | Koai et al. ............... 427/248.1 |
| 6,106,625 A | * | 8/2000 | Koai et al. .................. 118/715 |
| 6,136,690 A | * | 10/2000 | Li .............................. 438/627 |
| 6,153,519 A | * | 11/2000 | Jain et al. ................... 438/681 |
| 6,214,714 B1 | * | 4/2001 | Wang et al. ................ 438/584 |
| 6,338,880 B1 | * | 1/2002 | Akram ................ 427/255.394 |
| 6,372,643 B1 | * | 4/2002 | Hill et al. ................... 438/643 |

\* cited by examiner

PLASMA-ENHANCED CHEMICAL VAPOR DEPOSITION OF A METAL NITRIDE LAYER

BACKGROUND OF THE INVENTION

1. Field of the Invention

The present invention relates to the metallization of apertures to form void-free interconnections, including contacts or vias in high aspect ratio sub-half micron applications. More particularly, the present invention relates to a new metal nitride deposition process and apparatus.

2. Background of the Related Art

Sub-half micron multilevel metallization is one of the key technologies for the next generation of very large scale integration ("VLSI"). The multilevel interconnections that lie at the heart of the technology require planarization of high aspect ratio apertures, including contacts, vias, lines, or other features. Reliable formation of these interconnects is very important to the success of VLSI and to the continued effort to increase circuit density and quality of individual substrates and dies.

Physical vapor deposition ("PVD") of aluminum (Al) or copper (Cu) is a common method to fill apertures. However, a problem with the PVD Al layer is the formation of voids which occur through a key hole process wherein the top portion of the via becomes sealed before the via has been entirely filled. As a consequence, as disclosed in U.S. Pat. No. 5,877,087 entitled "Low temperature integrated metallization process and apparatus" issued to Mosely et al. on Mar. 2, 1999 and as disclosed in its divisional United States patent application with an application Ser. No. 08/792,292 which are both incorporated herein by reference, a low temperature integrated metallization process has been developed to form void-free contacts or vias. The process comprises depositing a thin glue layer comprising a refractory metal. Possible glue layers include, but is not limited to, a titanium (Ti) and a titanium nitride (TiN) layer or a tantalum (Ta) and a tantalum nitride (TaN) layer. After the glue layer a conformal wetting layer of chemical vapor deposition (CVD) Al (or CVD Cu) is formed at low temperatures over the glue layer for the receipt of a layer of physical vapor deposition ("PVD") Al (or PVD Cu) thereon. Then, a PVD Al (or PVD Cu) layer is deposited onto the previously formed CVD Al (or CVD Cu) layer at a temperature below that of the melting point temperature of Al (or Cu). This low temperature integrated metallization process results in a CVD/PVD Al (or Cu) layer that is substantially void-free.

However, a problem with this low temperature integrated metallization process is that high wiring resistance is found for features of dimensions less than 0.2 um. The high wiring resistance problem arises mainly with integrated circuit applications where sintering at 450° Celsius for 30 minutes is performed upon completion of all process steps to repair any damage to the capacitors. There are three major causes of the high wiring resistance problem. First, the Ti/TiN layer readily decomposes and interacts at elevated temperatures (e.g. at 450° Celsius) with an adjacent metal such as Al to form $TiAl_x$. As a result of $TiAl_x$ formation on the sidewalls of apertures, the effective linewidth of the feature is reduced. Second, the TiN layer formed by metallo-organic chemical vapor deposition usually contains certain levels of impurities. At elevated temperatures, the impurities easily diffuse into the adjacent metal, which results in high resistivity. Third, the chemical vapor deposition of TiN using metallo-organic precusors forms a relatively thick layer of TiN on the sidewalls of apertures. This effectively reduces the line width of metal lines, especially for very thin lines.

Therefore, there is a need for a metallization process for creating line features that are void-free, have low resistivity, and greater effective line width. More particularly, it would be desirable to have a low temperature process for filling such contacts and vias with a glue layer and a metal layer where the glue layer does not react with the metal layer to form impurities, has fewer impurities that diffuse into the metal layer, and has less sidewall coverage of apertures.

SUMMARY OF THE INVENTION

The present invention generally provides improved metallization of apertures to form continuous, void-free interconnections with reduced resistivity and greater effective line width, including contacts or vias in high aspect ratio sub-half micron applications. More particularly, the present invention provides a low temperature process for filling such apertures with a glue layer and a metal layer where the glue layer does not react with the metal layer to form impurities, has fewer impurities that diffuse into the metal layer, and has less sidewall coverage of the apertures.

In one aspect of the invention, a refractory metal layer is deposited onto a substrate having high aspect ratio contacts or vias formed thereon. Next, a plasma-enhanced CVD (PECVD) refractory metal nitride layer is deposited on the refractory metal layer. Then, a metal layer is deposited over the metal nitride layer. PECVD of the metal nitride layer comprises contacting a plasma of a metal precursor gas, a nitrogen-containing gas, and a hydrogen-containing gas with the substrate to form a metal nitride layer. The deposited metal nitride layer is preferably treated with nitrogen plasma to densify the metal nitride film. The present invention reduces the interaction between the metal nitride layer and the metal layer at high temperatures because the PECVD metal nitride layer releases less impurities and has better microstructure compared to a metal nitride layer deposited by MOCVD. In addition, the metal layer has a lower resistivity because of the improved metal nitride layer. The resulting metal layer is substantially void free, has reduced resistivity, and has greater effective line width.

The present invention further provides an apparatus for providing improved step coverage and planarization of metal layers. The apparatus comprises an integrated processing system that generally includes various chambers so that once the substrate is introduced into a vacuum environment, the metallization of the vias and contacts occurs without exposure to possible contaminants.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides a method and an apparatus for improved metallization of apertures to form continuous, void-free interconnections with reduced resistivity and greater effective line width, including contacts or vias in high aspect ratio sub-half micron applications. One aspect of the invention provides a method for metallizing apertures where a refractory metal layer is deposited onto a substrate having high aspect ratio apertures formed thereon. Next, a PECVD refractory metal nitride layer is formed on the refractory metal layer such as described in more detail below. Then, a metal layer is deposited over the metal nitride layer. The process is preferably carried out in an integrated processing system that includes various chambers so that once the substrate is introduced into a vacuum environment, the metallization of the vias and contacts occurs without exposure to possible atmospheric contaminants.

Figure 1:
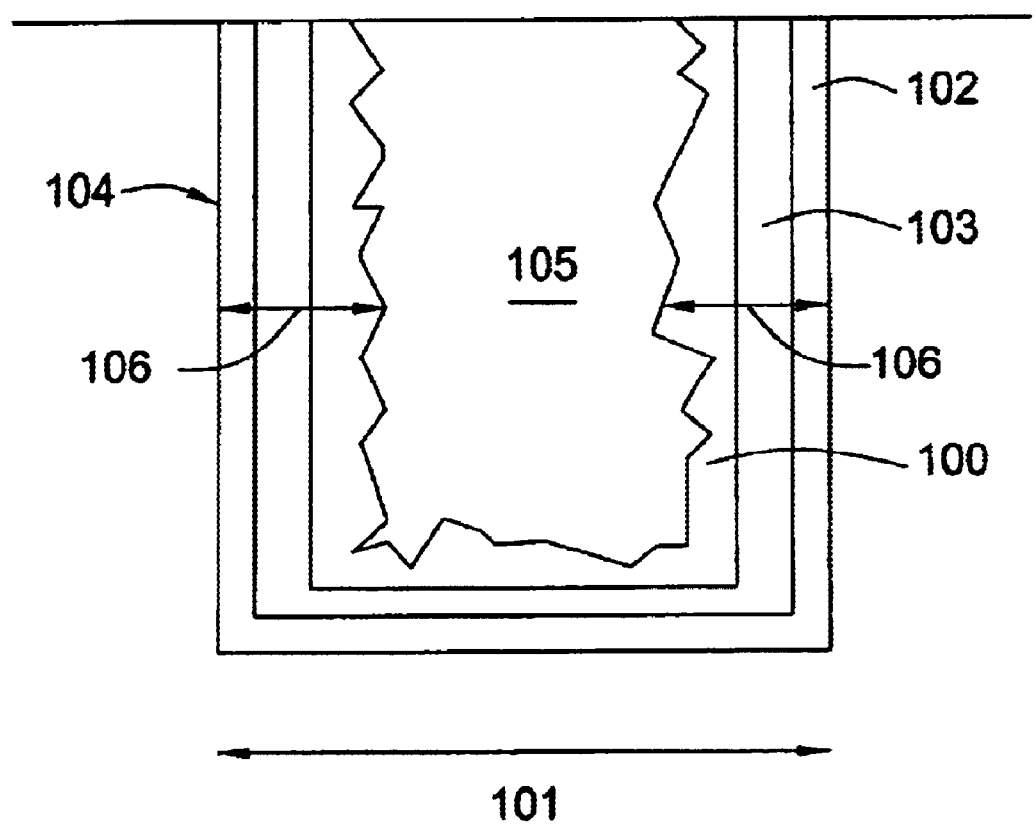
FIG. 1 is a schematic cross-section diagram of the prior art of the effective wiring line width of an aperture.

The current low temperature integrated metallization process of depositing a metal layer over a barrier/wetting layer suffers from the problem of high metal resistivity. One of the reasons this problem occurs is that a TiN barrier/wetting layer at elevated temperatures (e.g. at 450° Celsius) readily decomposes and interacts with an adjacent metal layer, such as an Al metal layer to form $TiAl_x$ (where x is a counting number). The $TiAl_x$ diffuses into the Al layer which causes the Al to have a higher resistivity. In addition, as shown in FIG. 1, $TiAl_x$ formation 100 further reduces the linewidth 101 of the feature when Al is deposited on a Ti layer 102/TiN layer 103. $TiAl_x$ 100 forms over the TiN layer 103 on the sidewalls 104 of the aperture 105 causing significant linewidth reduction 106.

The present invention involves an improved method of depositing a metal nitride barrier/wetting layer which releases less impurities and has less interactions with the metal layer. The improved method of forming a PECVD metal nitride layer on a substrate comprises injecting a mixture of a metal-containing compound, a nitrogen-containing gas, and a hydrogen-containing gas in a chamber; and generating a plasma from the mixture to deposit a metal nitride layer on the substrate.

A plasma is established from a mixture which includes a hydrogen-containing gas during the metal nitride deposition step because the hydrogen atoms, in its excited energy state, is reactive enough to scavenge the impurities in the metal nitride deposition process. The metal nitride film is preferably TiN. In depositing TiN, the metal-containing compound used is preferably tetrakis-dimethylamino-titanium (TDMAT) precursor gas. Carbon impurities exist in the reaction of a metallo-organic TDMAT precursor gas to form a TiN layer. Using hydrogen plasma in the deposition step results in a metal nitride layer that releases less impurities, and, thus, results in a metal nitride layer which decomposes less rapidly at high temperatures and reacts less with a metal layer that is applied to it. Furthermore, a cleaner metal nitride layer means that fewer impurities diffuse through the layer to react with the above metal layer. In addition, a PECVD TiN film has a resistivity that is reduced by about a factor of 5 when compared to a metallo-organic CVD TiN film.

Using hydrogen plasma in the deposition step is preferable to using hydrogen plasma to post treat a deposited metal nitride film. In post-treating a metal nitride film, the effect of the hydrogen plasma is reduced because the carbon impurities are already formed in themetal nitride film. Another advantage of using hydrogen plasma during the deposition step is that the plasma also in situ cleans the chamber. Thus, the throughput of processing the substrate is increased as a result of less time needed to clean the chamber.

The process of forming a PECVD metal nitride film is also advantageous because the resulting film has a poly-crystalline structure whereas a MOCVD metal nitride film has an amorphous structure. In a poly-crystalline structure, the metal and nitrogen bonds are stronger than in an amorphous structure. Thus, the metal nitride creates a better barrier layer to a metal layer that is applied over it. Furthermore, using a PECVD metal nitride layer, rather than a MOCVD metal nitride layer, results in greater effective line width for apertures because a PECVD metal nitride forms a thinner layer on the sidewalls of apertures.

The process of depositing a metal nitride film can also comprise the step of treating the metal nitride film with nitrogen plasma. The nitrogen plasma improves the microstructure of the metal nitride film because both PECVD and MOCVD metal nitride films are not sufficiently densified during the deposition step. A nitrogen plasma treatment reduces the resistivity of a PECVD TiN film by about a factor of 10 when compared to a metallo-organic CVD TiN film and by about a factor of 2 when compared to a PECVD TiN film without a nitrogen plasma treatment. The densified metal nitride film is also a better barrier because the denser film prevents the diffusion of metals through the metal nitride film. In addition, the process of depositing a metal nitride film can further comprise pretreating the substrate with argon plasma before deposition of the metal nitride. Pretreating the substrate with argon plasma expels any contaminants on the surface of the substrate when the substrate was exposed to atmospheric conditions.

Figure 2:
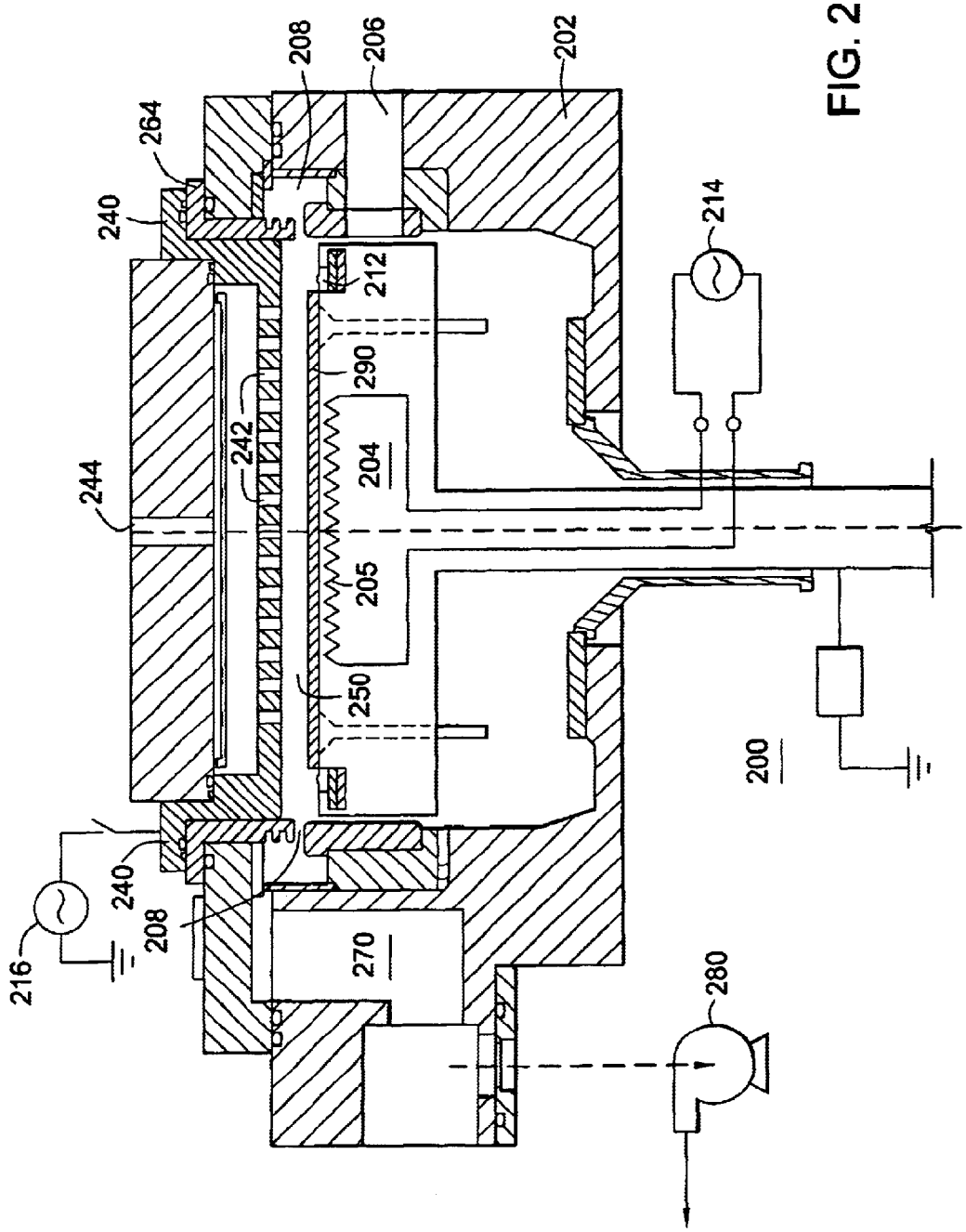
FIG. 2 is a schematic cross-sectional view of a PECVD chamber configured for performing the processes according to the present invention.

FIG. 2 illustrates a schematic cross-sectional view of an example of a PECVD chamber suitable for performing the process of the present invention. This specific reactor, a TxZ chamber 200, is available commercially from Applied Materials, Inc., of Santa Clara, Calif. Details of this chamber have been disclosed in commonly-assigned U.S. Pat. No. 5,846,332, entitled "Thermally Floating Pedestal Collar in a Chemical Vapor Deposition Chamber", issued Dec. 8, 1998, and commonly-assigned U.S. Pat. No. 5,993,916, entitled "Method for Substrate Processing with Improved Throughput and Yield", issued Nov. 30, 1999, both which are incorporated herein by reference. The TxZ chamber 200 is adapted for operation in a reduced pressure environment through connection to a vacuum pump 280 via a pumping channel 208. The chamber 200 comprises a chamber body 202 and a pedestal 204 that supports a substrate 290 to be processed. The substrate 290 is transferred in and out of the chamber 200 through a slit valve 206, and is centered upon the pedestal 204 by a centering ring 212. A suitable robotics transfer assembly is described in commonly-assigned U.S. Pat. No. 4,951,601, entitled "Multi-chamber Integrated Process System" issued on Aug. 28, 1990, the complete disclosure of which is incorporated herein by reference.

During processing, the substrate 290 is placed in close proximity to a gas distribution faceplate, or a showerhead 240, which includes a larger number of passageways 242 to allow the flow of a process gas from a gas inlet 244 into a processing zone 250 inside the chamber 200. Film deposition occurs on the surface of the substrate 290 when the process gas reacts at the substrate 290. Any excess process gas and byproducts are subsequently pumped out of the chamber 200 through an annular pumping channel 208, which is connected to a pumping plenum 270.

The PECVD chamber 200 includes an electrical power source 214 which supplies power to a resistive heater 205 of the pedestal 204. The pedestal 204, and thus the substrate 290, can be maintained at an elevated temperature. The PECVD chamber also includes a RF source 216 which provides RF power which is applied to the showerhead 240, which acts as an upper electrode. The showerhead 240 is electrically insulated from the rest of the chamber 200 by the annular isolator ring 264, typically made of an electrically non-conductive ceramic. Sufficient voltage and power is applied by the RF source 216 to generate a plasma from the process gases within the processing region 250. The chamber 200 is designed to minimize undesirable deposition upon various chamber components—e.g., the centering ring 212 is maintained at a lower temperature than the pedestal 204, such that film deposition on the centering ring can be minimized.

Figure 2A:
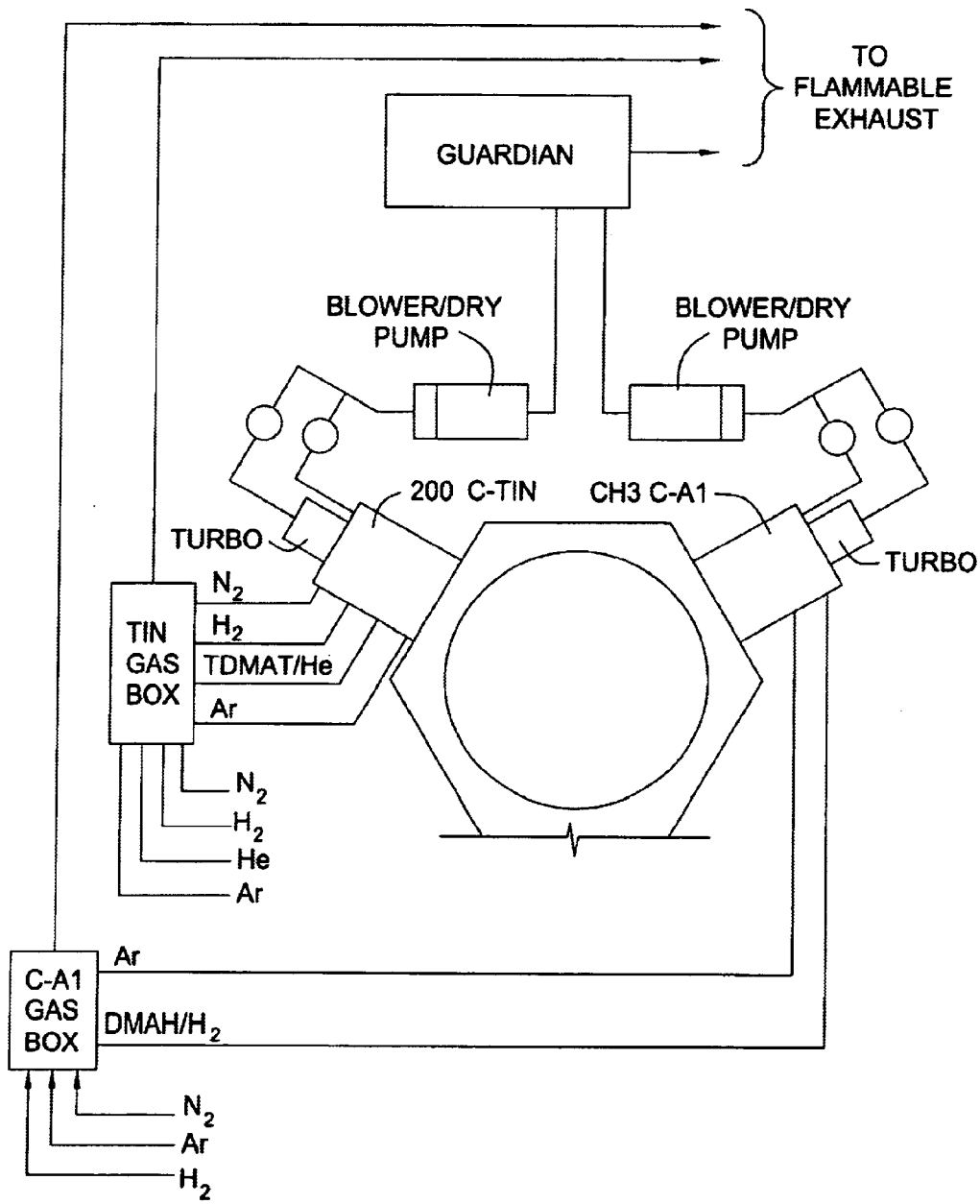
FIG. 2a is a schematic diagram of a gas box system for supplying gases to the PECVD chamber 200 of FIG. 2.

In the preferred process of depositing a metal nitride, a mixture of a metal-containing compound (like TDMAT), a nitrogen-containing gas, and a hydrogen gas is injected into the chamber 200 through the showerhead 240. The metal-containing compound can be introduced through the showerhead 240 by bubbling a carrier gas, such as helium, through a liquid sample of the metal-containing compound contained in an ampoule or bubbler (not shown). Alternatively, a direct liquid injection system may also be used to introduce the metal-containing compound into the chamber 200. A plasma is generated from the mixture when power is applied to the RF source 216. The power level applied to the RF source 216 is preferably 350 to 1000 watts, and most preferably at 750 watts. The mixture preferably comprises a molar ratio from the range of 5:1 to 1:1 of hydrogen to nitrogen. The mixture most preferably comprises a molar ratio of about 4 to 1 hydrogen to nitrogen. Preferably, the nitrogen-containing gas is nitrogen gas and the hydrogen-containing gas is hydrogen gas. If nitrogen gas and hydrogen gas are used, the gases are preferably injected at a flow rate of the hydrogen gas at 200 sccm and the a flow rate of the nitrogen gas at 50 sccm. FIG. 2a is a schematic diagram of a gas box system for supplying gases to the PECVD chamber 200 in FIG. 2. When PECVD TiN is to be used, the gas box is supplied with $N_2$, $H_2$, He, and Ar. The reactant TDMAT along with the inert gas He is passed into the chamber 200 for processing. The substrate 290 is heated from the pedestal 204 which is set at a temperature in a range that is preferably from about 350° C. to about 500° C. The substrate is preferably heated to a temperature in a range that is preferably from about 300° C. to about 450° C. The heater spacing is set at a distance of about 250 mils to about 500 mils, and preferably at 300 mils. The chamber pressure is maintained at a pressure from about 1 torr to about 10 torr, and preferably at about 3 torr. The thickness of the metal nitride depends on the intended use of the metal nitride. However, the preferable thickness is from about 10 angstroms to about 200 angstroms with a thickness of 50 angstroms most preferred. After deposition of the metal nitride on the substrate 290, the metal nitride film is treated with a nitrogen plasma. A nitrogen gas is introduced into the chamber 200 through the showerhead 240. A plasma is generated from the nitrogen gas when power is applied to the RF source 216. The power level applied to the RF source 216 is preferably 350 to 1000 watts, and most preferably at 750 watts. The substrate 290 is heated to a temperature that is preferably about 350° C. to about 500° C. The chamber pressure is maintained at a pressure that is preferably from about 1 torr to 5 torr, and most preferably at 1.5 torr. The substrate is treated with the nitrogen plasma for a time period that is preferably from about 20 seconds to about 70 seconds, and most preferably for about 35 seconds.

The present invention further provides a method of forming a feature on a substrate comprising the steps of depositing a refractory metal layer over the surface of an aperture, depositing a PECVD refractory metal nitride layer over the surface of the refractory metal layer, and depositing a metal layer over the refractory metal nitride layer.

It has been demonstrated that some soft metals, such as Al and Cu can flow at temperatures below their respective melting points due to the effects of surface tension. However, these metals have a tendency to dewet from an underlying dielectric layer at high temperatures. Therefore, the present invention interposes the barrier/wetting layer between a metal layer and the dielectric to improve the wetting of the metal. An appropriate barrier/wetting layer is one that wets the metal better than the dielectric material. It is preferred that the barrier/wetting layer provide improved wetting even when only a thin barrier/wetting layer is deposited. It follows that a preferred barrier/wetting layer is formed substantially uniformly over the surface of the dielectric, including the walls and floors of apertures.

According to the present invention, the barrier/wetting layer comprises a refractory metal layer formed over the dielectric layer and then the PECVD metal nitride layer formed over the refractory metal layer. The underlying refractory metal layer is preferably Ti but can also include, but is not limited to, Tantalum (Ta), tungsten (W), niobium (Nb), cobalt (Co), and molybdenum (Mo). The refractory metal layer can be deposited by either PVD or CVD processes. The metal nitride layer is formed by PECVD over the refractory metal layer. The PECVD processes of the present invention have been discussed above. The metal nitride layer is preferably TiN. The preferred barrier/wetting layer is a Ti/TiN layer but the barrier/wetting layer can comprise of any of the above combinations of refractory metal layers and metal nitride layers.

Next, a metal layer is deposited on the barrier/wetting layer. Metal features formed in semiconductor devices, such as plugs and lines formed in vias and trenches, are typically made of Al. However, Cu and W can also be used. Normally, a Ti/TiN layer cannot be used as a barrier to a Cu metal layer because the Cu diffuses through the layer. Diffusion of Cu to the adjacent dielectric material can cause electrical shorts to occur. Cu can be used over the Ti/TiN layer of the present invention because the PECVD TiN film is a denser than a MOCVD TiN film and acts as a sufficient barrier to prevent Cu diffusion through PECVD TiN film. Preferably, the metal layer is deposited first by a CVD metal conformal wetting layer applied over the barrier/wetting layer without sealing the top of the vias. Then a PVD metal layer is deposited thereon. Alternatively, the metal layer can be deposited by just a PVD step. Still another alternative is that the metal layer can be deposited by depositing a seed metal layer over the metal nitride layer and then electroplating a metal layer over the seed metal layer.

Figure 3:
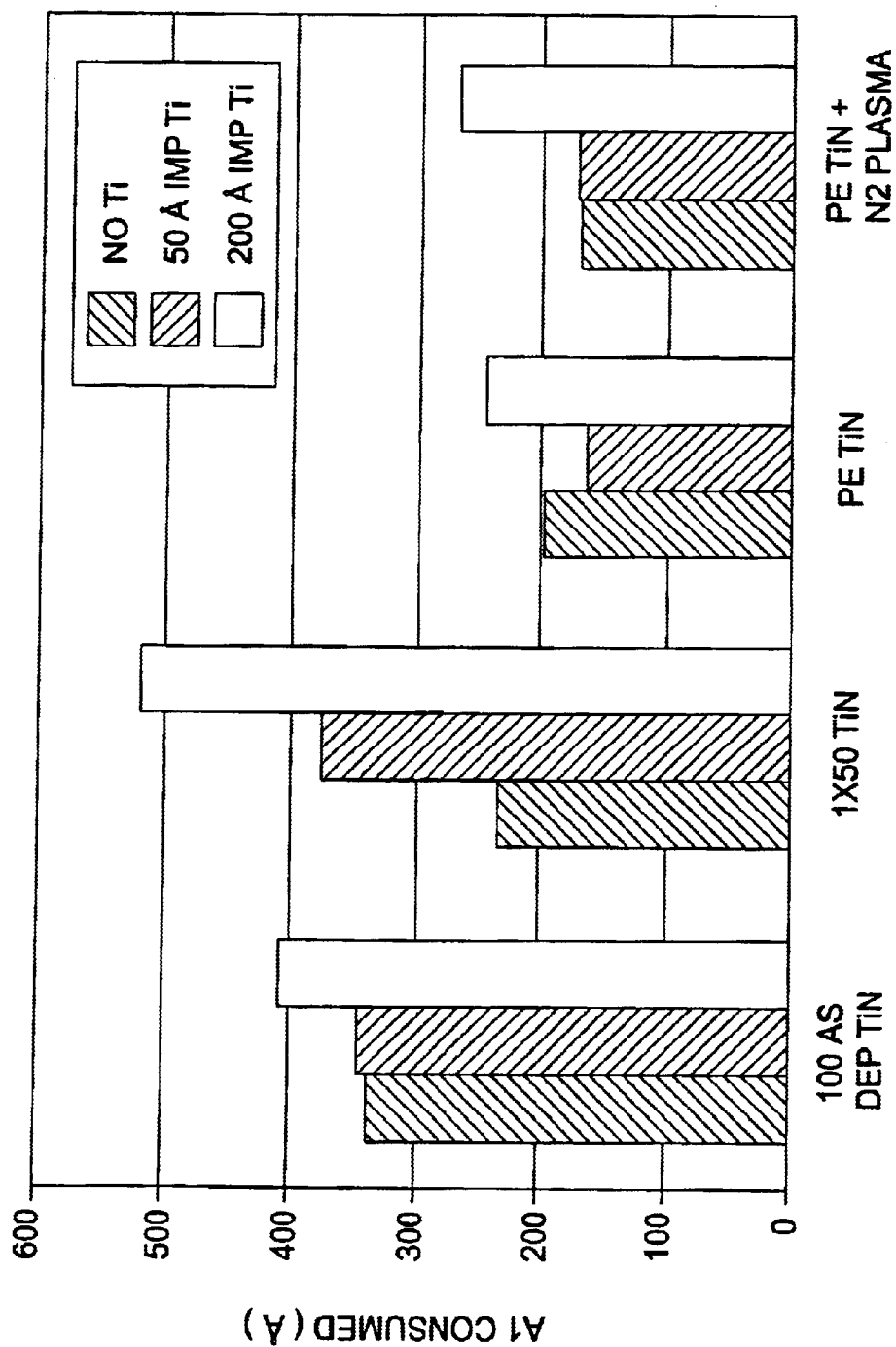
FIG. 3 is a graph comparing the amount of Al consumed by MOCVD TiN and PECVD TiN.

The resulting metal layer applied over a barrier/wetting layer is substantially void free, has reduced resistivity, and has greater effective line width. As shown in FIG. 3, PECVD TiN is a better barrier between the underlying refractory metal layer and the metal layer above. FIG. 3 compares the reactivity of 100 Å as dep TiN, 1×50 Å TiN, PECVD TiN, and nitrogen-plasma-treated PECVD TiN with Al upon annealing at 450° C. in a nitrogen gas furnace for 30 minutes. For each case, 1000 Å of Al is deposited on the TiN and the amount of Al consumed is calculated. FIG. 3 shows that both PECVD TiN and nitrogen-plasma-treated PECVD TiN consume less of the Al layer formed over the metal nitride layer. PECVD TiN reduces the amount of Al consumed by 30%. With less Al consumption and less $TiAl_x$ formation, the Al feature has a greater effective linewidth and a lower resistivity because of less $TiAl_x$ diffusion into the Al layer.

Using a PECVD metal nitride liner does not compromise the low temperature integrated metallization process. Electron micrographs show complete fill for low temperature integrated Al metallization of an aperture with PECVD TiN as liner material with thicknesses of 0.25 um, 0.35 um, and 0.45 um. Complete fill was demonstrated for a film stack made up of 200 Å of IMP Ti, about 100 Å of nitrogen-plasma-treated PECVD TiN, 600 Å of CVD Al, and 10 kÅ of PVD Al. PVD Al was deposited at a temperature of about 400° C. Electron micrographs also confirm the good step coverage of PECVD TiN on apertures of 0.25 um, 0.35 um, and 0.45 um.

The process of forming a feature on a substrate can be performed in either a multi-chamber processing apparatus (e.g., a cluster tool) having PECVD, CVD, and PVD chambers, or separate single-chamber systems. The use of a multi-chamber apparatus is preferred because the substrate can be kept within a vacuum environment to prevent contamination between processing steps.

Figure 4:
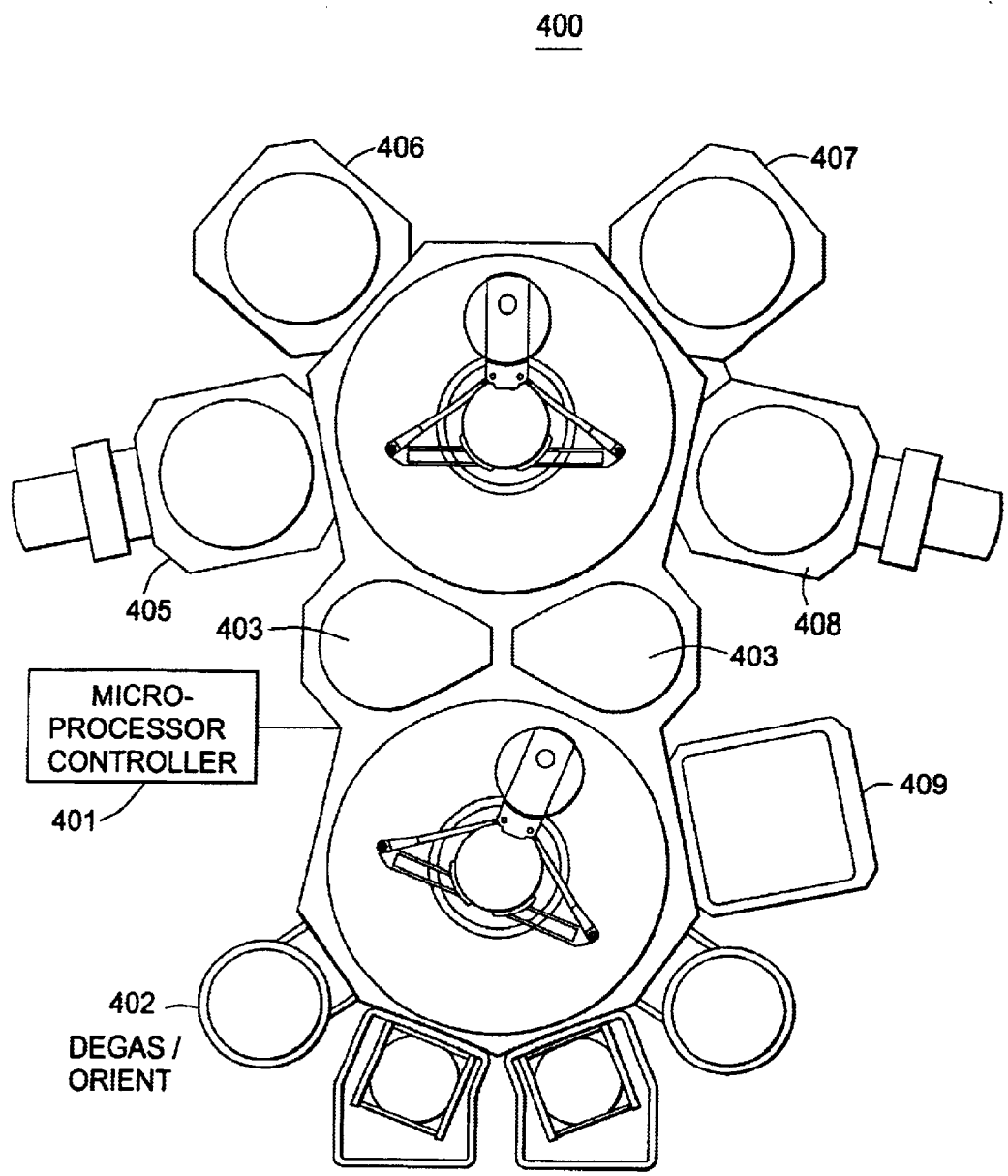
FIG. 4 is an integrated multi-chamber processing apparatus configured for sequential metallization in accordance with the present invention.

FIG. 4 depicts a schematic illustration of a multi-chamber process apparatus 400, an Endura system commercially available from Applied Materials, Inc., Santa Clara, Calif. A similar staged-vacuum wafer processing system is disclosed in U.S. Pat. No. 5,186,718 entitled "Staged-Vacuum Wafer Processing System and Method" issued to Tepman et al. on Feb. 16, 1993, which is herein incorporated by reference.

A microprocessor controller 401 is provided to control the sequence and formation of the desired film layers on the substrates. The cluster tool generally includes a de-gas chamber 402 wherein the substrates are introduced to outgas contaminants. The substrate is then moved into a pre-clean chamber 403 where the surface of the substrate is cleaned. Depending on the particular application, the substrate is moved by the robot into a chamber 405 to deposit a metal refractory layer like a CVD or PVD chamber. Next, the substrate is moved into a chamber 406 to deposit a PECVD metal nitride. The apparatus further comprises a hydrogen gas source in communication with the metal nitride chamber. Following deposition of the PECVD metal nitride, the substrate is moved into a CVD metal chamber 407. Next, the substrate is processed in PVD metal chamber 408. The substrate can be further processed in a PVD TiN anti-reflection coating ("ARC") chamber 409 for reducing the reflectivity of the surface and improving the photolithographic performance of the layer.

It should be appreciated that one of ordinary skill in the art would appreciate the structure and operation of the chambers shown in FIG. 4. Generally, the chambers typically include an enclosure, a substrate support member located within the enclosure and means for providing deposition material to be deposited on the substrates, and power means to provide an electrical bias within the chambers. The cluster tool also generally includes two robots for transferring the substrate through the processing steps required for the formation of film layers thereon.

The processes of the present invention can be implemented using a computer program product that runs on a conventional computer system comprising a central processor unit (CPU) interconnected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program. A suitable hierarchical control structure of the present computer program is disclosed in United States patent application with an application Ser. No. 08/792,292, which is herein incorporated by reference.

While the foregoing is directed to the preferred embodiment of the present invention, other and further embodiments of the invention may be devised without departing from the basic scope thereof, and the scope thereof is determined by the claims that follow.

What is claimed is:

1. A method of depositing a titanium nitride film on a substrate, comprising:
    (a) injecting a mixture of a titanium metallo-organic precursor compound, nitrogen gas, and hydrogen gas in a chamber;
    (b) generating a plasma from the mixture; and
    (c) depositing a titanium nitride film on the substrate.

2. The method of claim 1, further comprising:
    (d) treating the titanium nitride film with a nitrogen plasma.

3. The method of claim 1, further comprising pretreating the substrate with an argon plasma before step (a).

4. The method of claim 1, wherein the titanium metallo-organic compound comprises tetrakis-dimethylamino-titanium (TDMAT).

5. The method of claim 1, wherein the hydrogen gas and the nitrogen gas are injected into the chamber at a flow rate ratio of about 4:1 of the hydrogen gas to the nitrogen gas.

6. The method of claim 1, wherein the substrate is heated to a substrate temperature from about 300° C. to about 450° C.

7. The method of claim 1, wherein the chamber is maintained at a pressure from about 1 torr to about 10 torr.

8. The method of claim 1, wherein the chamber has a heater spacing from about 250 mils to about 500 mils.

9. The method of claim 1, wherein the plasma is generated from a RF source supplied with a power level at a range from about 350 watts to about 1000 watts.

10. The method of claim 1, wherein the titanium nitride film is deposited to a thickness from about 10 angstroms to about 200 angstroms.

11. The method of claim 1, wherein the titanium nitride film is deposited over a refractory metal layer selected from the group of titanium, tantalum, tungsten, molybdenum, niobium, and cobalt.

12. The method of claim 1, wherein a metal layer is deposited over the titanium nitride film selected from the group of aluminum, copper, and tungsten.

13. A method of depositing a refractory metal nitride layer on a substrate, comprising:
   (a) injecting a mixture of a refractory metal metallo-organic (MO) precursor compound, a nitrogen gas, and a hydrogen gas in a chamber;
   (b) generating a plasma from the mixture at a pressure in a range from about 1 torr to about 10 torr; and
   (c) depositing the refractory metal nitride layer having good step coverage on the surface of the substrate.

14. The method of claim 13, further comprising:
   (d) treating the refractory metal nitride layer with a nitrogen plasma.

15. The method of claim 14, wherein in treating the refractory metal nitride layer, the substrate is contacted with the nitrogen plasma generated from a RF source supplied with a power level from about 350 watts to about 1000 watts for a time period from about 20 seconds to 70 seconds.

16. The method of claim 13, further comprising pretreating the substrate with a plasma comprising argon before step (a).

17. The method of claim 13, wherein the refractory metal nitride layer is a titanium nitride layer.

18. The method of claim 17, wherein the refractory metal metallo-organic (MO) precursor compound is tetrakis-dimethylamino-titanium (TDMAT).

19. The method of claim 13, wherein the mixture comprises a molar ratio from about 5:1 to about 1:1 of hydrogen gas to nitrogen gas.

20. The method of claim 13, wherein the substrate is heated to a temperature from about 300° C. to about 450° C.

21. The method of claim 13, wherein the plasma is generated from a RF source supplied with a power level at a range from about 350 watts to about 1000 watts.

22. The method of claim 13, wherein the refractory metal nitride layer is deposited to a thickness from about 10 angstroms to about 200 angstroms.

23. The method of claim 13, wherein the refractory metal nitride layer is deposited over a refractory metal layer.

24. The method of claim 23, wherein the refractory metal layer is selected from the group of titanium, tantalum, tungsten, molybdenum, niobium, and cobalt.

25. The method of claim 13, wherein a metal layer is deposited over the refractory metal nitride layer.

26. The method of claim 25, wherein the metal layer is selected from the group of aluminum, copper, and tungsten.

27. The method of claim 13, wherein a hydrogen plasma generated from the hydrogen gas removes carbon impurities during deposition of the refractory metal nitride layer.

28. The method of claim 27, wherein the hydrogen plasma cleans the chamber during deposition of the refractory metal nitride layer.

* * * * *